(12) United States Patent
Lu et al.

(10) Patent No.: US 9,887,179 B2
(45) Date of Patent: Feb. 6, 2018

(54) LIGHT EMITTING DIODE DEVICE AND LIGHT EMITTING DEVICE USING THE SAME

(71) Applicant: Harvatek Corporation, Hsinchu (TW)

(72) Inventors: Hsin-I Lu, Hsinchu County (TW);
Hui-Yen Huang, Hsinchu (TW);
Yu-Ching Kuo, Hsinchu (TW);
Yu-Ping Wang, Hsinchu (TW);
Jen-Hung Chang, Hsinchu County (TW)

(73) Assignee: Harvatek Corporation, Hsinchu (TW)

( * ) Notice: Subject to any disclaimer, the term of this patent is extended or adjusted under 35 U.S.C. 154(b) by 22 days.

(21) Appl. No.: 14/670,398

(22) Filed: Mar. 26, 2015

(65) Prior Publication Data
US 2016/0155727 A1    Jun. 2, 2016

(30) Foreign Application Priority Data
Nov. 28, 2014 (TW) .............................. 103141453 A

(51) Int. Cl.
| | |
|---|---|
| H01L 25/075 | (2006.01) |
| H01L 33/54 | (2010.01) |
| H01L 33/62 | (2010.01) |
| F21K 99/00 | (2016.01) |
| F21V 3/00 | (2015.01) |
| F21K 9/238 | (2016.01) |
| F21K 9/232 | (2016.01) |

(Continued)

(52) U.S. Cl.
CPC .......... *H01L 25/0753* (2013.01); *F21K 9/238* (2016.08); *F21K 9/232* (2016.08); *F21Y 2103/10* (2016.08); *F21Y 2115/10* (2016.08); *H01L 33/62* (2013.01); *H01L 2224/48091* (2013.01); *H01L 2224/48137* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 6,113,248 A | * | 9/2000 | Mistopoulos | F21V 23/06 |
| | | | | 362/219 |
| 7,535,098 B2 | * | 5/2009 | Tseng | H05K 3/06 |
| | | | | 136/201 |

(Continued)

FOREIGN PATENT DOCUMENTS

| | | |
|---|---|---|
| CN | 201582593 U | 9/2010 |
| CN | 202352721 U | 7/2012 |

(Continued)

*Primary Examiner* — Robert Carpenter
(74) *Attorney, Agent, or Firm* — CKC & Partners Co., Ltd.

(57) ABSTRACT

A light emitting diode device including a substrate, a plurality of light emitting elements, and an encapsulant. The substrate has a front surface and a back surface opposite to the front surface. The substrate includes a first portion and a second portion. The first portion has a plurality of light-penetrating holes. The second portion is separated from the first portion. The light emitting elements are disposed adjacent to the light-penetrating holes and on the front surface of the first portion. The encapsulant is disposed on the front surface of the substrate, and covers the light emitting elements.

11 Claims, 7 Drawing Sheets

(51) Int. Cl.
 *F21Y 103/10* (2016.01)
 *F21Y 115/10* (2016.01)

(56) References Cited

U.S. PATENT DOCUMENTS

| | | | | |
|---|---|---|---|---|
| 8,410,726 | B2* | 4/2013 | Dau | H05B 33/0845 |
| | | | | 315/307 |
| 2006/0145340 | A1 | 7/2006 | Tseng et al. | |
| 2007/0018191 | A1 | 1/2007 | Roh et al. | |
| 2009/0152665 | A1 | 6/2009 | Tseng et al. | |
| 2010/0164409 | A1 | 7/2010 | Lo et al. | |
| 2010/0220479 | A1* | 9/2010 | Yamashita | F21K 9/00 |
| | | | | 362/249.02 |
| 2010/0270571 | A1* | 10/2010 | Seo | H01L 33/486 |
| | | | | 257/98 |

FOREIGN PATENT DOCUMENTS

| | | |
|---|---|---|
| CN | 203733792 U | 7/2014 |
| CN | 104075170 A | 10/2014 |
| CN | 203895450 U | 10/2014 |
| JP | 2008160106 A | 7/2008 |
| JP | 4592320 B2 | 12/2010 |
| TW | 531055 | 5/2003 |
| TW | 200414561 A | 8/2004 |
| TW | 201126693 A | 8/2011 |
| TW | I380483 B | 12/2012 |
| TW | M455263 | 6/2013 |
| TW | M467187 | 12/2013 |
| WO | 2011137662 A1 | 11/2011 |

* cited by examiner

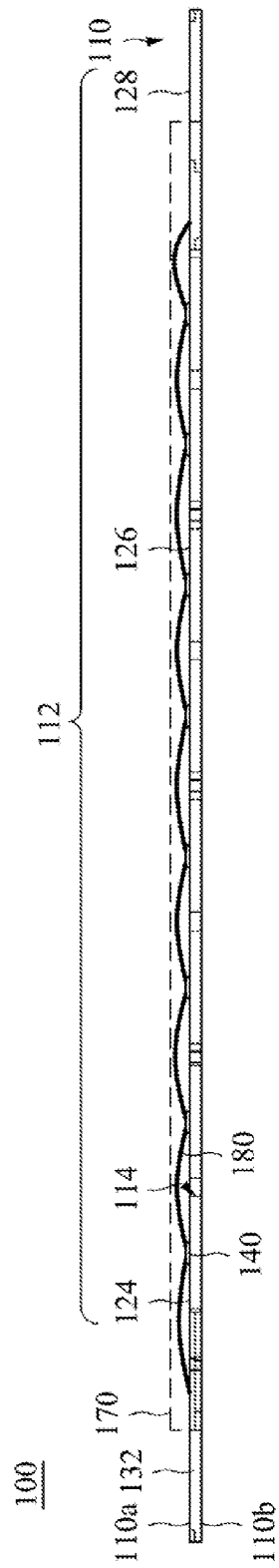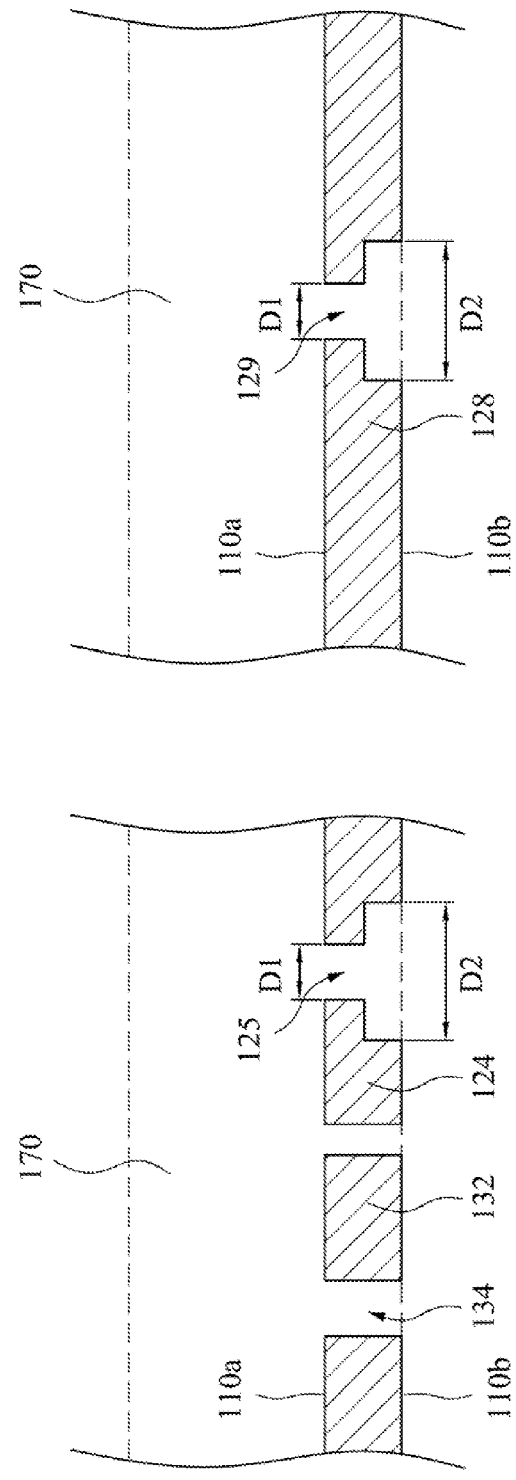

LIGHT EMITTING DIODE DEVICE AND LIGHT EMITTING DEVICE USING THE SAME

RELATED APPLICATIONS

This application claims priority to Taiwanese Application Serial Number 103141453, filed Nov. 28, 2014, which is herein incorporated by reference.

BACKGROUND

Field of Invention

The present invention relates to a light emitting diode (LED) device.

Description of Related Art

A packaging process of a light emitting diode is to perform the operations of die bonding, wire bonding, and encapsulating and exposing pins on a LED chip, thereby enabling the LED chip to be soldered on a print circuit board. Compared with a conventional light source, a LED package element has a certain market edge because of the advantages of low power consumption, high brightness, fast reaction speed, eco-friendliness, and lightness and compactness. Therefore, many in the industry are striving to provide a LED package element with high light emitting efficiency.

SUMMARY

The present invention is to provide a light emitting diode device including a substrate, a plurality of light emitting elements, and an encapsulant. The substrate has a front surface and a back surface opposite to the front surface. The substrate includes a first portion and a second portion. The first portion has a plurality of light-penetrating holes. The second portion is separated from the first portion. The light emitting elements are disposed adjacent to the light-penetrating holes and on the front surface of the first portion. The encapsulant is disposed on the front surface of the substrate, and covers the light emitting elements.

In one or more embodiments, the back surface of the substrate is incapable of contacting with the encapsulant.

In one or more embodiments, the encapsulant is disposed on the back surface of the substrate.

In one or more embodiments, the first portion of the substrate includes a first terminal and a supporting portion. The light emitting elements and the light-penetrating holes are disposed at the supporting portion, and the first terminal is disposed between the second portion and the supporting portion. A portion of the encapsulant contacting the back surface of the first terminal has a first thickness, and another portion of the encapsulant contacting the back surface of the supporting portion has a second thickness. The first thickness is greater than the second thickness.

In one or more embodiments, the first terminal has a through hole filled with the encapsulant.

In one or more embodiments, the first portion further includes a second terminal. The supporting portion is disposed between the first terminal and the second terminal. The second terminal has a through hole filled with the encapsulant.

In one or more embodiments, the second portion has a through hole filled with the encapsulant.

In one or more embodiments, a diameter of the through hole at the front surface is different from a diameter of the through hole at the back surface.

In one or more embodiments, the light emitting elements are arranged in a zigzag manner.

In one or more embodiments, the substrate further has a plurality of cutting holes arranged linearly. The light-penetrating holes are disposed at two opposite sides of the cutting holes.

In one or more embodiments, the substrate is tack structure.

The present invention is further to provide a light emitting device including a shell and the light emitting diode device disposed in the shell.

In one or more embodiments, the shell is a bulb shell or a candle lamp shell.

The light emitting diode devices of the aforementioned embodiments can provide omnidirectional light (i.e. the light can emit toward two sides of the substrate). Besides the light emitting elements themselves may emit light upwards, due to the internal reflection of the encapsulant, a portion of the light generated from the light emitting elements can be reflected by the encapsulant, and emitted downwards after passing through the light-penetrating holes, so as to form omnidirectional light.

BRIEF DESCRIPTION OF THE DRAWINGS

FIG. 2 is a schematic side view of the light emitting diode device of FIG. 1;

FIG. 3A is a schematic cross-sectional view viewed along line 3A-3A of FIG. 1;

FIG. 3B is a schematic cross-sectional view viewed along line 3B-3B of FIG. 1;

DETAILED DESCRIPTION

Figure 1:
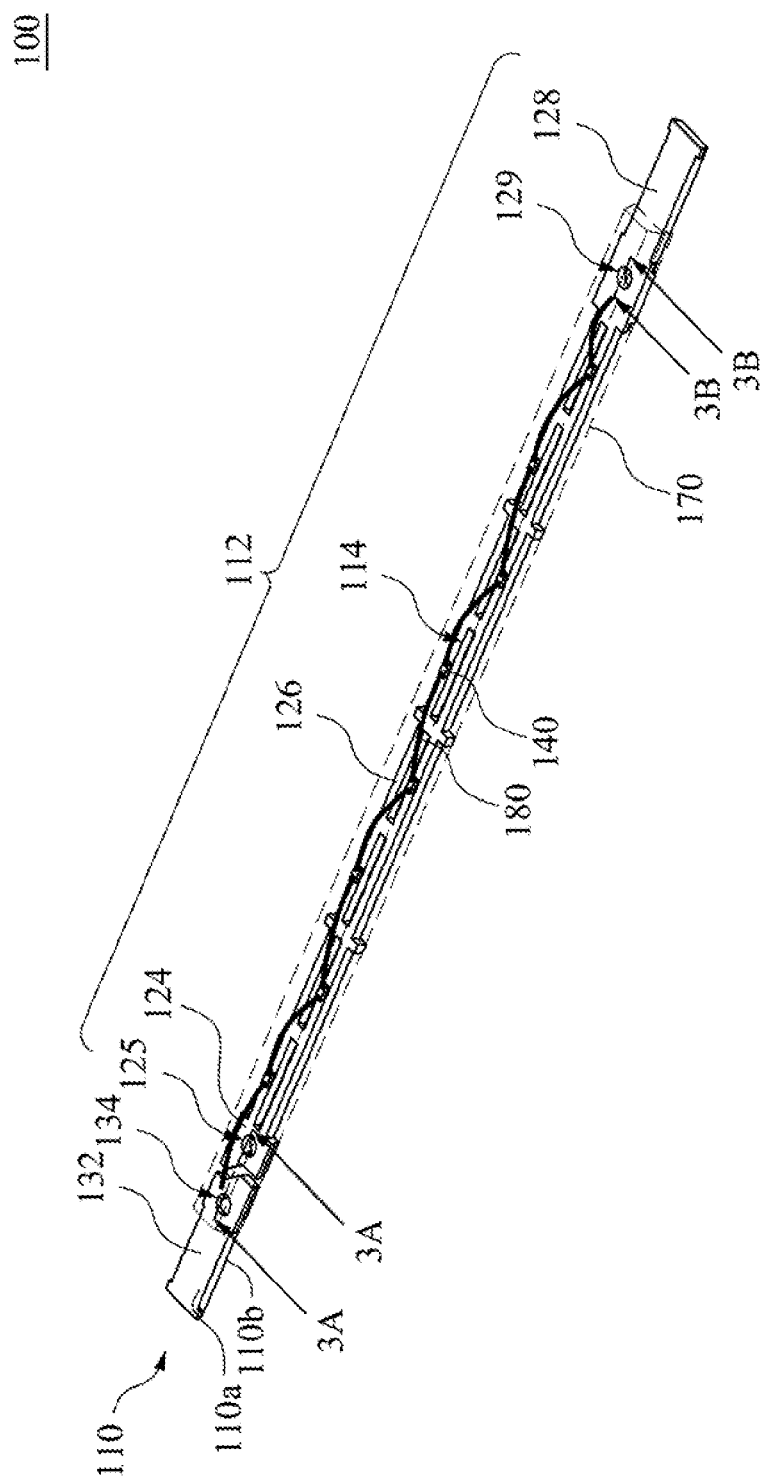
FIG. 1 is a schematic three dimensional view of a light emitting diode device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic three dimensional view of a light emitting diode device 100 according to one embodiment of the present invention, and FIG. 2 is a schematic side view of the light emitting diode device 100 of FIG. 1. As shown in figures, the light emitting diode device 100 includes a substrate 110, a plurality of light emitting elements 140, and an encapsulant 170. For clarity, the encapsulants 170 in FIGS. 1 to 8B are depicted with respective dash lines. The substrate 110 has a front surface 110a and a back surface 110b opposite to the front surface 110a The substrate 110 includes a first portion 112 and a second portion 132. The first portion 112 has a plurality of light-penetrating holes 114. The second portion 132 is separated from the first portion 112. The light emitting elements 140 are disposed adjacent to the light-penetrating holes 114 on the front surface 110a of the first portion 112. The encapsulant 170 is disposed on the front surface 110a of the substrate 110. For example, in this embodiment, the encapsulant 170 is disposed on the front surface 110a of the substrate 110 and exposes the back surface 110b of the substrate 110. Moreover, the encapsulant 170 covers the light emitting elements 140, and the light-penetrating holes are optionally filled with the encapsulant 170.

In brief, the light emitting diode device 100 of the present invention can provide omnidirectional light. Specifically speaking, besides the light emitting elements 140 themselves may emit light upwards, due to the total reflection occurring between the encapsulant 170 and the ambient medium, a portion of the light generated from the light emitting elements 140 can be emitted downwards after being totally reflected within the encapsulant 170, and another portion of the light can be emitted directly downwards to and pass through the light-penetrating holes 114, such that omnidirectional light can be performed. Compared with a conventional light emitting diode device, the light emitting diode device 100 of the present embodiment is not limited to adopting a transparent substrate, and the omnidirectional light can be obtained without need to cover the back surface 110b of the substrate 110 with the encapsulant 170. Hence, the substrate 110 can be made of high heat dissipating material to enhance the heat dissipation efficiency of the light emitting diode device 100. Moreover, since the back surface 110b does not need to be covered by the encapsulant 170, the overall thickness of the light emitting diode device 100 can be reduced and the illumination intensity from the back surface 110b can be enhanced.

In this embodiment, the light emitting element 140 can be a blue light emitting diode chip, and the encapsulant 170 can be a transparent material, such as silicone or epoxy, including yellow florescent powders therein. Hence, the light emitted from the light emitting element 140 can excite the yellow florescent powders of the encapsulant 170 to generate yellow light which then is mixed with the blue light to generate white light. For adjusting the color temperature of white light, such as warm white light, red florescent powders or green florescent powders can be optionally added to the encapsulant 170 to generate red light or green light when they are excited by the light emitted from the light emitting element 140. Moreover, when being excited by the light, the yellow light emitted from the yellow florescent powders will be scattered to change its propagation path, thereby raising the probability of the light passing through the light-penetrating holes 114, thus enhancing the light emitting intensity at the back surface 110b. Furthermore, since the white light can reach the back surface 110b through the light-penetrating holes 114, the back surface 110b does not need to be coated with the encapsulant 170.

In this embodiment, the substrate 110 may be made of metal, such as gold, silver, copper, iron, tin, etc, which has good electrical conduction and heat dissipation capability. The light-penetrating holes 114 can be formed in the substrate 110 by adopting an etching process. The shapes of the light-penetrating holes 114 in FIG. 1 are merely illustrative and do not intend to limit the claimed scope of the present invention. The first portion 112 of the substrate 110 can be an anode of the light emitting diode device 110, and the second portion 132 can be a cathode of the light emitting diode device 110. The light emitting elements 140 can be electrically connected to the first portion 112 and the second portion 132. For example, heat conductive glue, such as silver glue (not shown), is used to fix the light emitting elements 140 on the front surface 110a of the first portion 112 in advance. Conductive wires 180 such as golden wires or aluminum wires are connected to the anodes and the cathodes (not shown) of the light emitting elements 140 to form a series circuit (as shown in FIGS. 1 and 2), a parallel circuit, a circuit in which plural series circuits are connected in parallel, or a circuit in which plural parallel circuits are connected in series. Subsequently, the anode and the cathode of the light emitting elements 140 respectively disposed at the front end and the last end of the circuit are connected to first portion 112 and the second portion 132 respectively, and then the first portion 112 and the second portion 132 are connected to external power supply to provide power to the light emitting elements 140. However, in other embodiments, if the substrate 110 is made of insulating material, such as ceramic or silicone, two metal plates can be respectively fixed on the first portion 112 and the second portion 132 to form an electrical connection with the light emitting elements 140. However, the claimed scope of the present invention is not limited in this respect.

In this embodiment, the light emitting elements 140 can be arranged in a zigzag manner. In detail, in FIG. 1, the light-penetrating holes 114 can be arranged linearly along the extension direction of the substrate 110. Two adjacent light emitting elements 140 are respectively disposed at two opposite sides of an array formed by the light-penetrating holes 114. With this configuration, the distances among the light emitting elements 140 can be increased, such that the heat generated by the light emitting elements 140 when emitting light can be uniformly distributed in the substrate 110 so as to improve the heat dissipation efficiency of the substrate 110. Also, the light absorption among the light emitting diodes 140 can be reduced, and the light extraction efficiency of the light emitting diode device 100 can be enhanced. However, in other embodiments, the light emitting elements 140 can be arranged linearly or randomly as well.

FIG. 3A is a schematic cross-sectional view viewed along line 3A-3A of FIG. 1. Reference is made to FIGS. 1 and 3A. In this embodiment, the first portion 112 of the substrate 110 includes a first terminal 124 and a supporting portion 126. The light emitting elements 140 and the light-penetrating holes 114 are disposed on the supporting portion 126, and the first terminal portion 124 is disposed between the second portion 132 and the supporting portion 126. The first terminal 124 has a through hole 125 filled with the encapsulant 170. By filling the through hole 125, the encapsulant 170 can increase the overall structural strength of the light emitting diode device 100 and reduce the probability of the encapsulant 170 being peeled off from the substrate 110.

In this embodiment, the second portion 132 also has a through hole 134 filled with the encapsulant 170. Similarly, by filling the through hole 134, the encapsulant 170 can increase the overall structural strength of the light emitting diode device 100 and reduce the probability of the encapsulant 170 being peeled off from the substrate 110. Furthermore, the encapsulant 170 can increase the combination strength of the first portion 112 and the second portion 132.

FIG. 3B is a schematic cross-sectional view viewed along line 3B-3B of FIG. 1. Reference is made to FIGS. 1 and 3B. In this embodiment, the first portion 112 further includes a second terminal 128. The supporting portion 126 is disposed between the first terminal 124 and the second terminal 128. The second terminal 128 has a through hole 129 filled with the encapsulant 170. Similarly, by filling the through hole 129, the encapsulant 170 can increase the overall structural strength of the light emitting diode device 100 and reduce the probability of the encapsulant 170 being peeled off from the substrate 110. Furthermore, the encapsulant 170 can be tightly attached to the supporting portion 126 because filling the through hole 125 of the first terminal' 124 and the through hole 129 of the second terminal 128.

Reference is made to FIGS. 3A and 3B. In this embodiment, the through hole 134 is cylindrical, and a diameter D1 of the through hole 125 (129) at the front surface 110a is different from a diameter D2 of the through hole 125 (129) at the back surface 110b. For example, the diameter D2 is greater than the diameter D1. As shown in FIGS. 3A and 3B, each through hole 125 and 129 has a step configuration, such that the dimension of the portion of the encapsulant 170 near the back surface 110b is greater than that near the front surface 110a. With this configuration, the contact area between the encapsulant 170 and the through hole 125 (129) is increased to strengthen the assembly of the encapsulant 170 and the substrate 110, thereby preventing the encapsulant 170 from being peeled off from the through holes 125 and 129. However, the shapes of the through holes 125, 129, and 134 are merely illustrative, and should not limit the present invention. In other embodiments, the through hole 134 can have the same shape as the through hole 129 in FIG. 3A, or all of the through holes 125, 129, and 134 are cylindrical.

Figure 4:
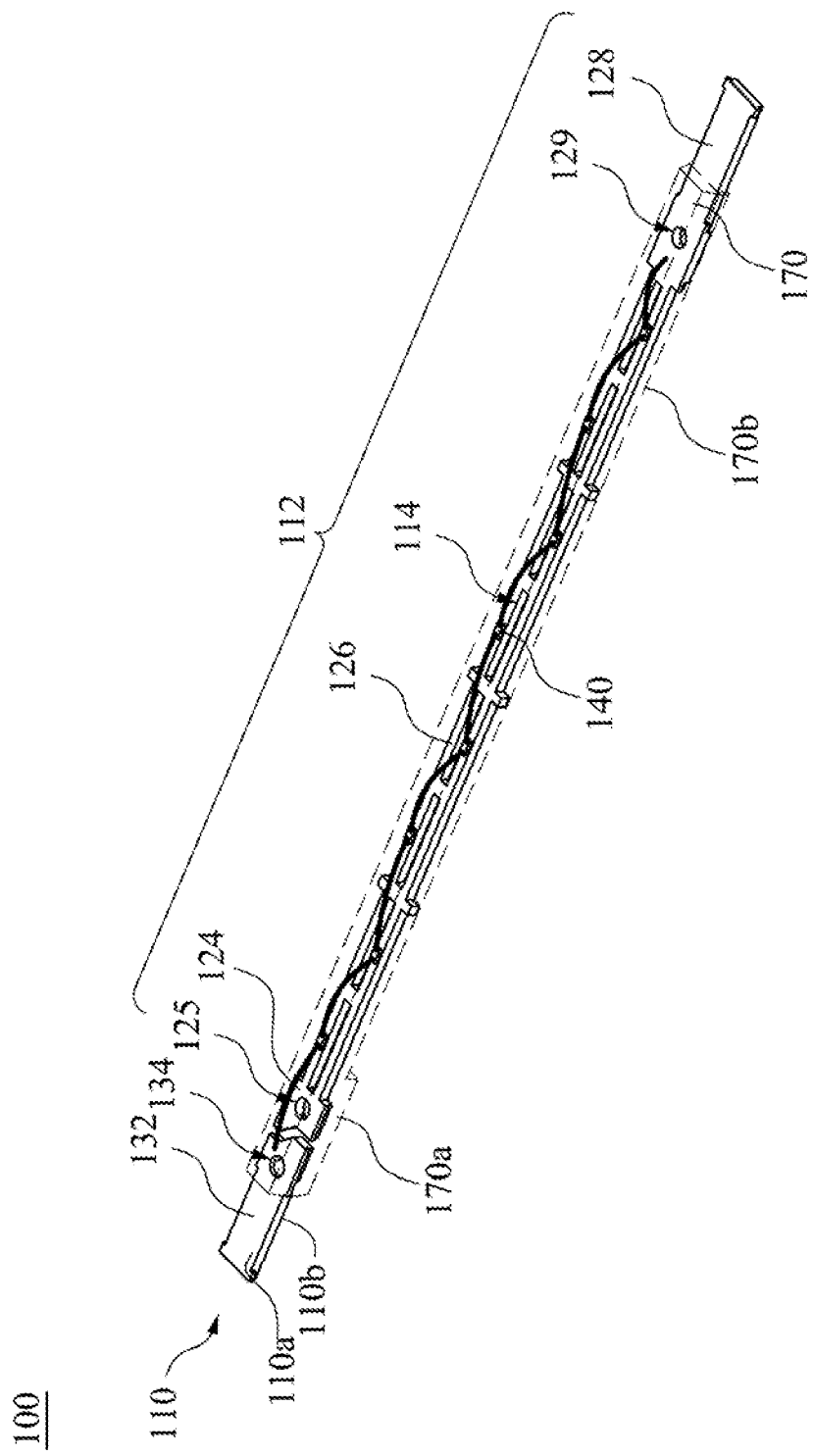
FIG. 4 is a schematic three dimensional view of a light emitting diode device according to another embodiment of the present invention.
Figure 5:
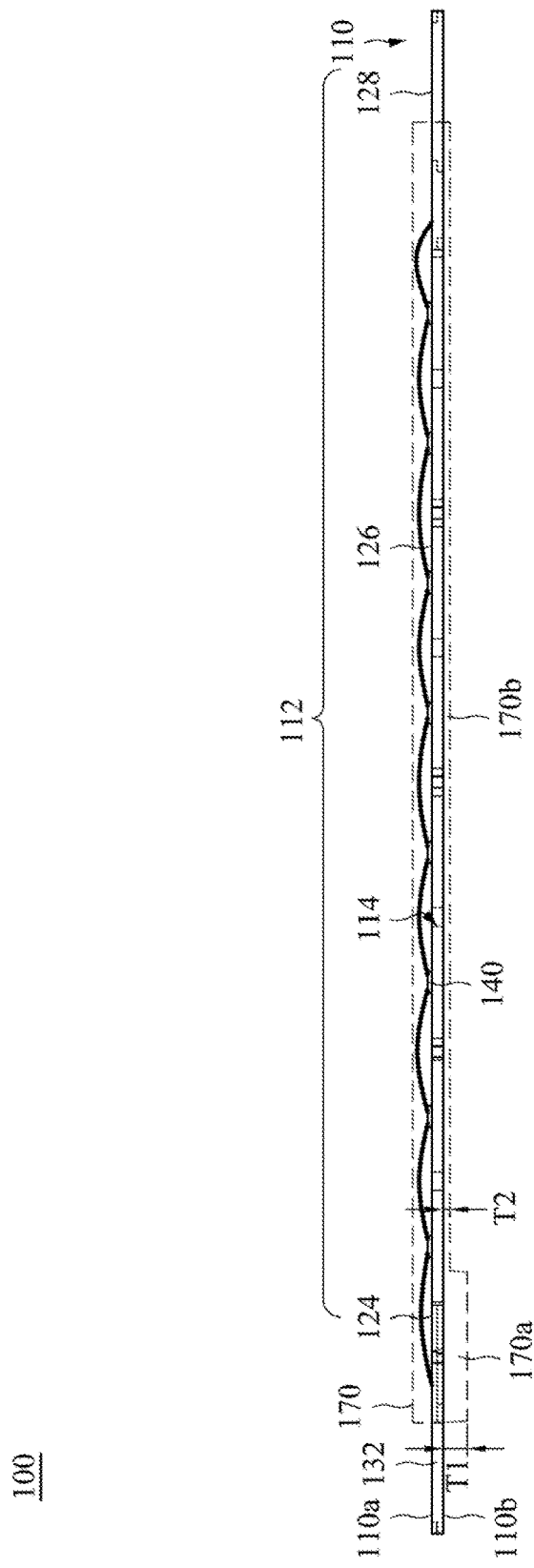
FIG. 5 is a schematic side view of the light emitting diode device of FIG. 4.

FIG. 4 is a schematic three dimensional view of a light emitting diode device 100 according to another embodiment of the present invention, and FIG. 5 is a schematic side view of the light emitting diode device 100 of FIG. 4. Reference is made to FIGS. 4 and 5. The difference between the present embodiment and the embodiment of FIGS. 1, 2 pertains to the structure of the encapsulant 170. In this embodiment, the encapsulant 170 is disposed on the back surface 110b of the substrate 110. A portion of the encapsulant 170a attaching to the back surface 110b of the first terminal 124 has a first thickness T1, and another portion of the encapsulant 170b attaching to the back surface 110b of the supporting portion 126 has a second thickness T2. The first thickness T1 is greater than the second thickness T2, and the second thickness T2 can be about 0.1 mm. More specifically, the encapsulant 170a is configured for enhancing the structural strength between the first portion 112 and the second portion 132 of the substrate 110. By increasing the first thickness T1, the probability of fracture between the first portion 112 and the second portion 132 can be reduced. The encapsulant 170b is configured for providing a uniform structural stress on the back surface 110b and preventing the substrate 110 from being curved. The encapsulant 170b can be further connected to the upper portion of the encapsulant 170 through the light-penetrating holes 114 to enhance the structural strength of the light emitting diode device 100. Since the encapsulant 170b is disposed below the supporting portion 126, i.e., below the light-penetrating holes 114, the second thickness T2 can be smaller than the first thickness T1 for preventing thick encapsulant 170b from affecting the light intensity of the back surface 110b. However, if the encapsulant 170b is highly transparent, the second thickness T2 can be greater than or equal to the first thickness T1, and the claimed scope is not limited in this respect. Other relevant structural details of the present embodiment are similar to the embodiment shown in FIGS. 1 and 2, and thus are not be described again hereinafter.

Figure 6:
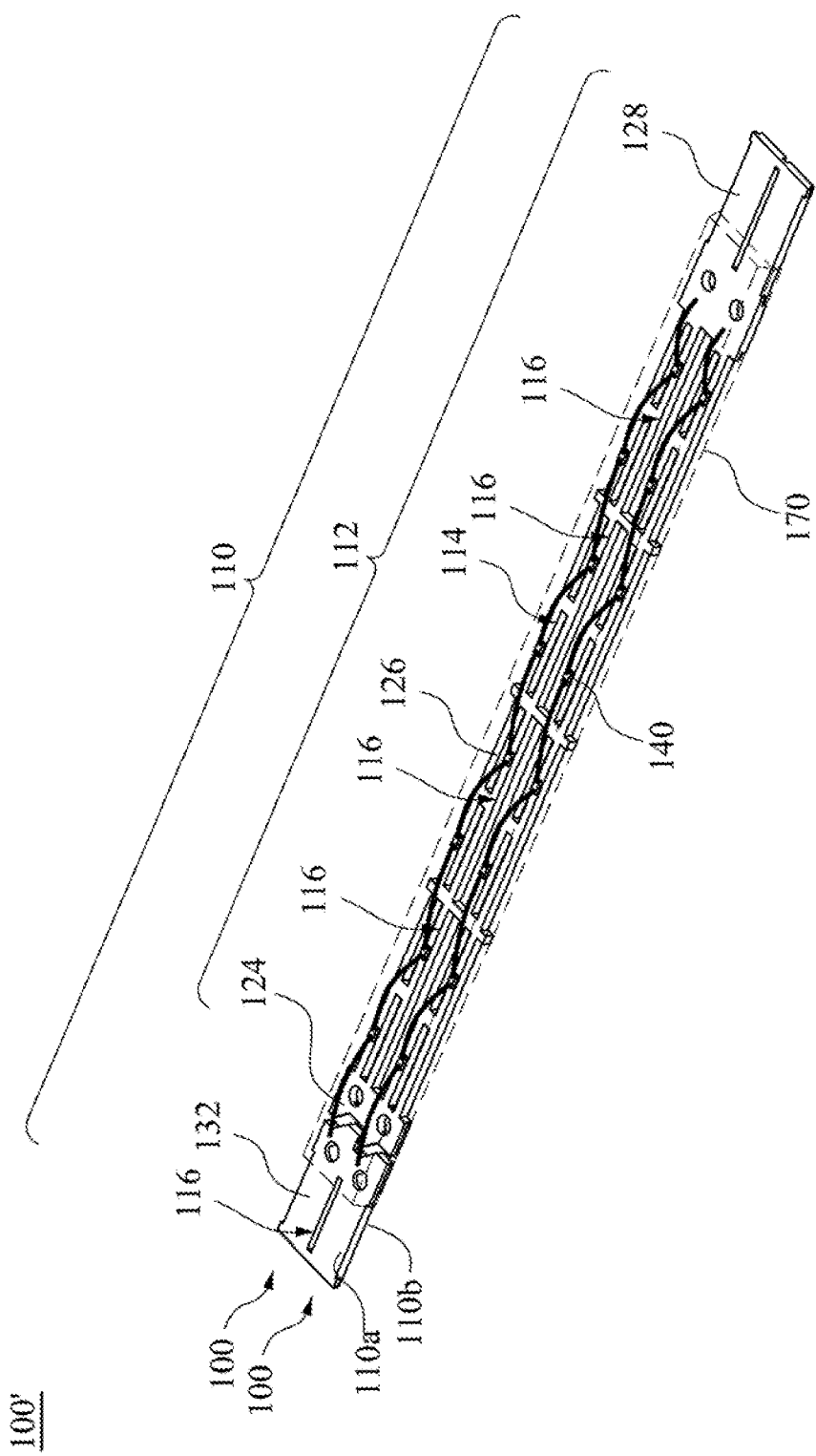
FIG. 6 is a schematic three dimensional view of a light emitting diode device according to still another embodiment of the present invention.

FIG. 6 is a schematic three dimensional view of a light emitting diode device 100' according to still another embodiment of the present invention. The light emitting diode device 100' of the present embodiment includes two light emitting diode devices 100 of FIG. 1. The first portion 112 of the substrate 110 of the light emitting diode device 100' is integrally formed, and the second portion 132 is integrally formed, and the encapsulant 170 is also integrally formed. The number of the light emitting elements 140 allowed to be disposed in the light emitting diode device 100' is twice of that allowed to be disposed in the light emitting diode device 100 of FIG. 1. Therefore, the power of the light emitting diode device 100' is twice as much as that of the light emitting diode device 100.

In this embodiment, the substrate 110 of the light emitting diode device 100' can further has a plurality of cutting holes 116 linearly arranged along the extension direction of the light emitting diode device 100'. The cutting holes 116 together divide the light emitting diode device 100' into two light emitting diode devices 100 and the transparent holes 114 are disposed at opposite sides of the cutting holes 116. The light emitting diode device 100' can be manufactured to form two light emitting diode devices 100 as long as it is divided along the cutting holes 116. In other words, the light emitting diode device 100 is formed by connecting two light emitting diode devices 100 of FIG. 1 in parallel. For example, a light emitting diode device arranged by a plurality of the light emitting diode devices 100 can be manufactured in advance, in which the first portion 112, the second portion 132, and the encapsulant 170 are respectively integrally formed. Thereafter, the light emitting diode device is divided along the corresponding cutting holes 116 according to desired light emitting powers, so as to manufacture the light emitting diode device 100 or 100' that meets requirements. This manufacture can be allowed to manufacture a plurality of the light emitting diode devices 100 and 100' by using one single mold, thus improving the manufacturing speed and lowering the manufacturing cost. Other relevant structural details of the present embodiment are similar to the embodiment of FIG. 1, and thus are not described again hereinafter.

Figure 7:
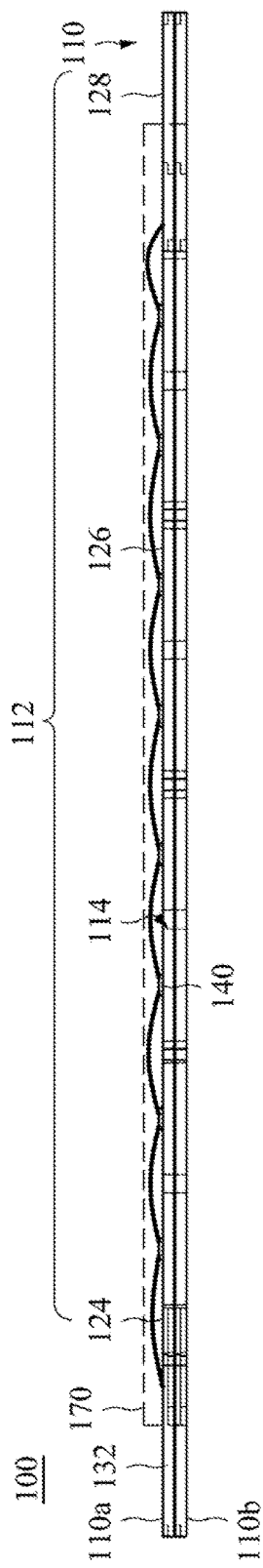
FIG. 7 is a schematic side view of a light emitting diode device according to still another embodiment.
Figure 8B:
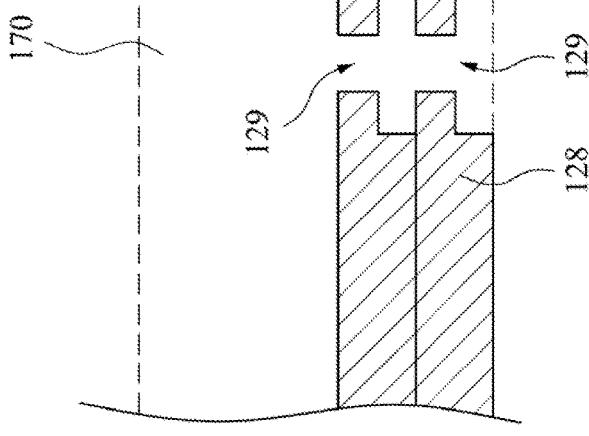
FIGS. 8A and 8B are enlarged cross-sectional views of FIG. 7.
Figure 8A:
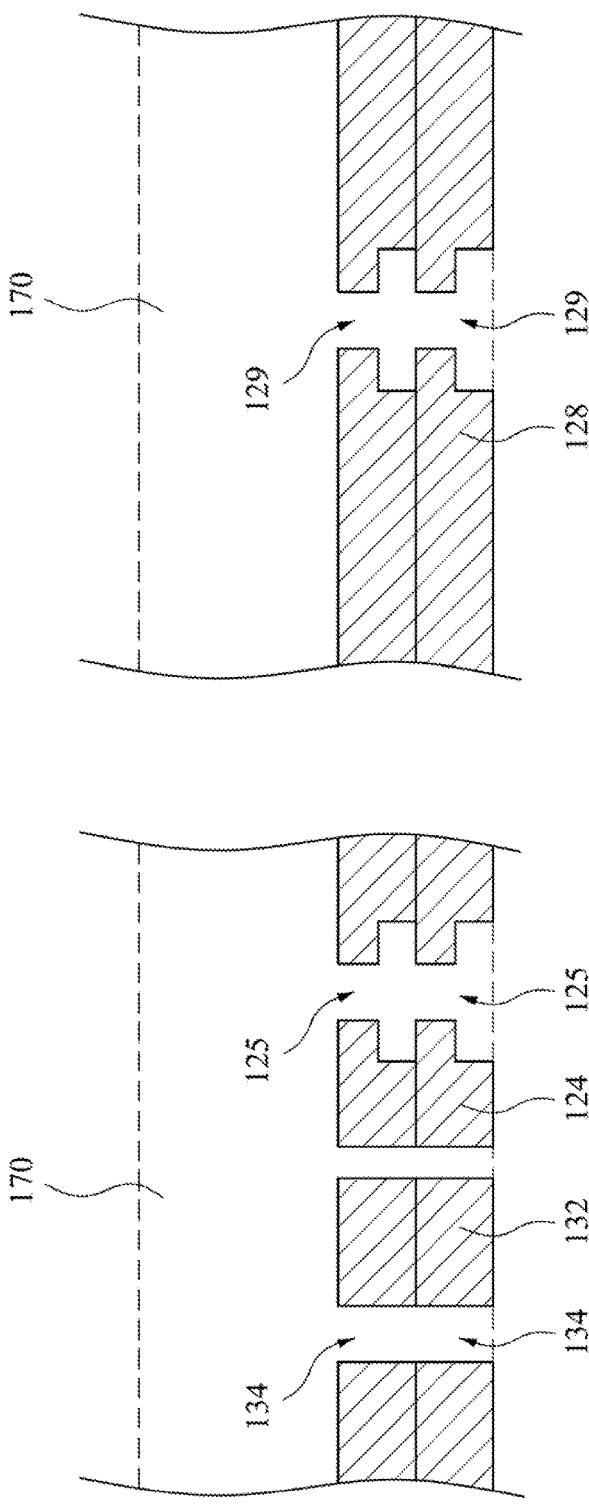

FIG. 7 is a schematic side view of a light emitting diode device 100 according to still another embodiment, and FIGS. 8A and 8B are enlarged cross-sectional views of FIG. 7, where the cross-sectional position in FIG. 8A is the same as the position in FIG. 3A, and the cross-sectional position in FIG. 8B is the same as the position in FIG. 3B. Reference is made to FIGS. 7 to 8B. The difference between the present embodiment and the embodiment of FIG. 2 pertains to the structure of substrate 110. In this embodiment, the substrate 110 is a stack structure, which enhances the overall robustness of the light emitting diode device 100 and prevents the light emitting diode device 100 from being curved. Also, there is no need to fabricate substrates with different thickness. Moreover, there is no need to laminate the stack structures of the substrate 110 in advance. The stack structures can be assembled as long as the transparent holes 114, the through holes 125, 129, and 134 are respectively lined up to fill with the encapsulant 170. Alternatively, an adhesive material such as an insulating adhesive or a conductive adhesive can be adhered between the stack structures. Other relevant structural details of the present embodiment are similar to the embodiment of FIG. 1, and thus are not described again hereinafter.

Figure 9:
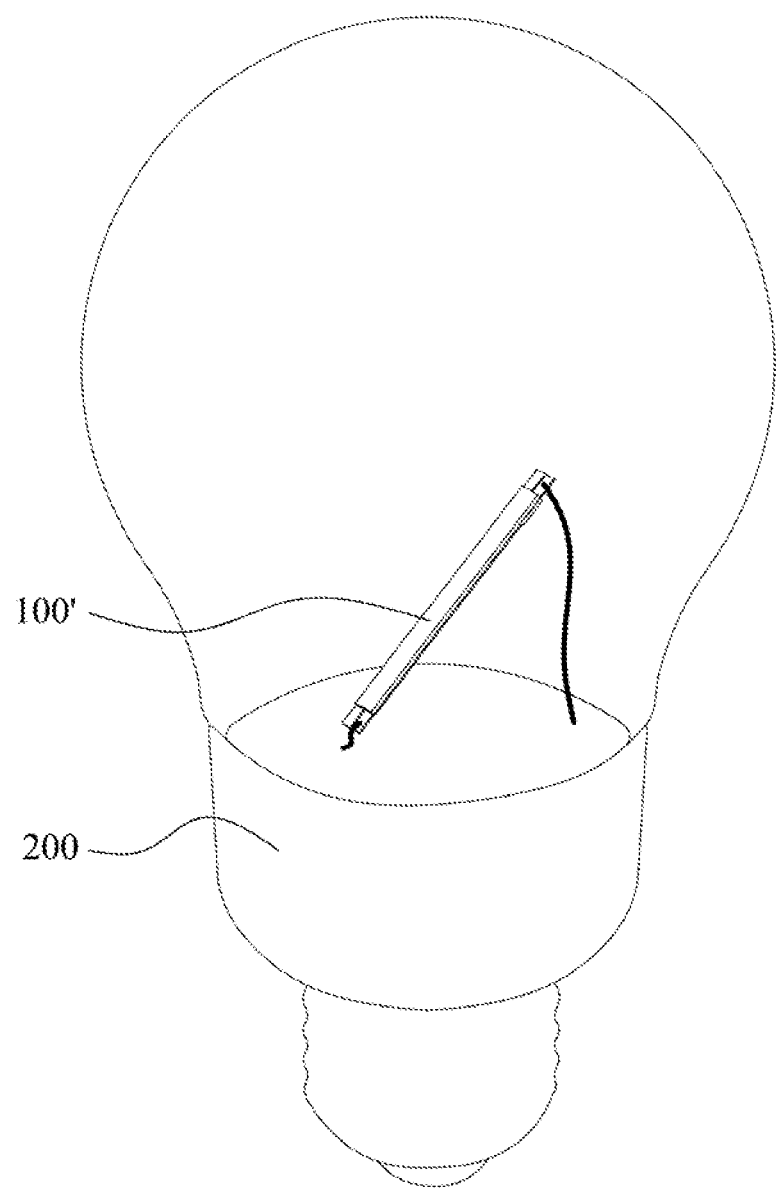
FIG. 9 is a schematic diagram of a light emitting device according to one embodiment.

Another aspect of the present invention is to provide a light emitting device including the aforementioned light emitting diode devices 100 and/or 100'. FIG. 9 is a schematic diagram of the ht emitting device according to one embodiment. The light emitting device includes a shell 200 and the aforementioned light emitting diode device 100' (or the light emitting diode device 100 of FIG. 1, 4, or 6) disposed in the shell 200. In one or more embodiments, the shell 200 may be a bulb shell (as shown in FIG. 9) or a candle lamp shell. That is, the light emitting diode devices 100 and 100' can be applied to a bulb lamp, a candle lamp, or other suitable light emitting devices. According to different powers, different light emitting diode devices 100 and 100' or a device combining a plurality of the light emitting diode devices 100 in parallel can be chosen, and the claimed scope is not limited in this respect.

In sum, the light emitting diode devices 100 and 100' according to the embodiments of the present invention can provide omnidirectional light. A portion light of the light emitting elements 140 can be reflected by the encapsulant 170, and emitted downwards after passing through the light-penetrating holes 114. Another portion of light can be emitted directly downwards from the light emitting elements 140 to the light-penetrating hole 114 and passes therethrough to form omnidirectional light. Compared with a conventional light emitting diode device, the light emitting diode devices 100 and 100' of the embodiments can choose a substrate with high heat dissipating. Also, the entire thickness is reduced, and the illumination intensity at the back surface 110b can be raised. In some embodiments, the substrate 110 can be made of metal (such as copper), which has good electrical conduction and heat dissipation capability. In some embodiments, the light emitting elements 140 can be arranged in a zigzag manner to improve the heat dissipation efficiency of the substrate 110. In some embodiments, all of the first terminal 124, the second terminal 128, and the second portion 132 respectively have through holes 125, 129 and 134. By filling the through holes 125, 129, and 134, the encapsulant 170 can increase the overall structural strength of the light emitting diode devices 100 and 100' and reduce the probability of the encapsulant 170 being peeled off from the substrate 110. The diameter D1 of the through hole 125 (129 or 134) at the front surface 110a can be different from the diameter D2 of the through hole 125 (129 or 134) at the back surface 110b to prevent the encapsulant 170 being peeled off from the through hole 125 (129 or 134). In some embodiments, the encapsulant 170 can be disposed on the back surface 110b of the substrate 110 to enhance the structural strength of the light emitting diode devices 100 and 100'. In some embodiments, a plurality of the light emitting diode devices 100 and 100' with different powers can be manufactured by using one single mold, thus improving the manufacturing speed and lowering the manufacturing cost. In some embodiments, the substrate 110 can be a stack structure so as to enhance the overall robustness of the light emitting diode device 100 and 100'. The aforementioned light emitting diode devices 100 and 100' are applicable to a bulb lamp, a candle lamp, or other suitable light emitting devices.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode device, comprising:
   a substrate having a front surface and a back surface opposite to the front surface, wherein the substrate comprises:
      a first portion having a plurality of light-penetrating holes, wherein the light-penetrating holes are arranged linearly along an extension direction of the substrate; and
      a second portion separated from the first portion;
   a plurality of light emitting elements which is disposed adjacent to the light-penetrating holes and on the front surface of the first portion, wherein the light emitting elements are arranged in a zigzag manner, and each two of the adjacent light emitting elements are respectively disposed at two opposite sides of an array formed by the light-penetrating holes; and
   an encapsulant which is disposed on the front surface of the substrate and covers the light emitting elements, wherein the back surface of the substrate is incapable of contacting with the encapsulant, and the back surface of the substrate and a bottom surface of the encapsulant are coplanar.

2. The light emitting diode device of claim 1, wherein the first portion of the substrate comprises a first terminal and a supporting portion, and the light emitting elements and the light-penetrating holes are disposed at the supporting portion, and the first terminal is disposed between the second portion and the supporting portion, and the first terminal has a through hole filled with the encapsulant.

3. The light emitting diode device of claim 2, wherein a diameter of the through hole at the front surface is different from a diameter of the through hole at the back surface.

4. The light emitting diode device of claim 1, wherein the first portion of the substrate comprises a first terminal, a supporting portion and a second terminal, and the first terminal is disposed between the second portion and the supporting portion, and the supporting portion is disposed between the first terminal and the second terminal, and the second terminal has a through hole filled with the encapsulant.

5. The light emitting diode device of claim 4, wherein a diameter of the through hole at the front surface is different from a diameter of the through hole at the back surface.

6. The light emitting diode device of claim 1, wherein the second portion has a through hole filled with the encapsulant.

7. The light emitting diode device of claim 6, wherein a diameter of the through hole at the front surface is different from a diameter of the through hole at the back surface.

8. The light emitting diode device of claim 1, wherein the substrate further has a plurality of cutting holes arranged linearly, and the light-penetrating holes are disposed at two opposite sides of the cutting holes.

9. The light emitting diode device of claim 1, wherein the substrate is a stack structure.

10. A light emitting device, comprising:
    a shell; and
    the light emitting diode device of claim 1 disposed in the shell.

11. The light emitting device of claim 10, wherein the shell is a bulb shell or a candle lamp shell.

\* \* \* \* \*